US007082295B2

(12) United States Patent
Chien

(10) Patent No.: US 7,082,295 B2
(45) Date of Patent: Jul. 25, 2006

(54) ON-CHIP LOOP FILTER FOR USE IN A PHASE LOCKED LOOP AND OTHER APPLICATIONS

(75) Inventor: Hung-Ming (Ed) Chien, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 441 days.

(21) Appl. No.: 10/406,168

(22) Filed: Apr. 3, 2003

(65) Prior Publication Data

US 2004/0198278 A1 Oct. 7, 2004

(51) Int. Cl.
*H04M 1/66* (2006.01)

(52) U.S. Cl. .............. 455/260; 455/259; 455/258; 455/257; 455/183.1; 331/11; 331/17; 331/16

(58) Field of Classification Search ............ 455/260, 455/259, 258, 257, 183.1
See application file for complete search history.

(56) References Cited

U.S. PATENT DOCUMENTS

| 6,078,634 | A * | 6/2000 | Bosshart .................. 375/376 |
| 6,356,160 | B1 * | 3/2002 | Robinson et al. .......... 331/17 |
| 6,407,643 | B1 * | 6/2002 | Canard et al. ............. 331/16 |
| 6,456,831 | B1 * | 9/2002 | Tada ..................... 455/180.3 |
| 6,563,387 | B1 * | 5/2003 | Hirano et al. ............ 331/11 |
| 6,674,331 | B1 * | 1/2004 | McDowell ................ 331/16 |
| 6,900,700 | B1 * | 5/2005 | Oosawa et al. ........... 331/46 |
| 6,906,596 | B1 * | 6/2005 | Kitamura et al. ......... 331/36 C |

* cited by examiner

*Primary Examiner*—Nay Maung
*Assistant Examiner*—Richard Chan
(74) *Attorney, Agent, or Firm*—Garlick Harrison & Markison; Timothy W. Markison

(57) ABSTRACT

A phase locked loop that includes such a loop filter, the phase locked loop includes a difference detector, programmable charge pump, fixed loop filter, voltage controlled oscillator and adjustable divider module. The difference detector is operably coupled to determine a different signal based on differences in phase and/or frequency between a reference oscillation and a feedback oscillation. The programmable charge pump is operably coupled to generate a charge current based on the difference signal and a scaling signal. The fixed loop filter is operably coupled to convert the charge current into a control voltage. The voltage controlled oscillator generates an output oscillation based on the control voltage and the adjustable divider module generates the feedback oscillation based on the output oscillation and a divider value. The scaling module is operably coupled to produce the scaling signal based on the selected divider.

30 Claims, 6 Drawing Sheets local oscillation module 74 local oscillation module 74

US 7,082,295 B2

ON-CHIP LOOP FILTER FOR USE IN A PHASE LOCKED LOOP AND OTHER APPLICATIONS

BACKGROUND OF THE INVENTION

1. Technical Field of the Invention

This invention relates generally to mixed signal circuitry and more particularly to phase locked loops.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The local oscillations used in both the transmitter and receiver may be produced by the same or different local oscillation generators. In either case, a local oscillator generator is typically implemented using a fractional N-synthesizer. As is known, a fractional N-synthesizer has a phase lock loop (PLL) topology that allows for fractional adjustments of the feedback oscillation via a feedback fractional N divider. As is also known, the fractional adjustments of the fractional N divider allow for fine tuning of the local oscillation such that, for example, a particular channel may be tuned, a particular intermediate frequency may be achieved, et cetera.

While a fractional-N synthesizer allows for fine-tuning of the local oscillator, its accuracy is limited by the linearity of its components. As is known, a fractional-N synthesizer includes a phase frequency detector, a charge pump, a loop filter, a voltage controlled oscillator and a divider module. Typically, the components that constitute the loop filter have large values and, as such, are large devices if implemented on an integrated circuit. Thus, the loop filter components are generally off-chip, which requires the integrated circuit to include extra pins and requires the corresponding printed circuit board to include extra components.

Therefore, a need exists for an on-chip loop filter that is relatively small with respect to die area and yet provides the desired filtering response.

BRIEF SUMMARY OF THE INVENTION

The loop filter of the present invention substantially meets these needs and others. In an embodiment of a phase locked loop that includes such a loop filter, the phase locked loop includes a difference detector, programmable charge pump, fixed loop filter, voltage controlled oscillator and adjustable divider module. The difference detector is operably coupled to determine a different signal based on differences in phase and/or frequency between a reference oscillation and a feedback oscillation. The programmable charge pump is operably coupled to generate a charge current based on the difference signal and a scaling signal. The fixed loop filter is operably coupled to convert the charge current into a control voltage. The voltage controlled oscillator generates an output oscillation based on the control voltage and the adjustable divider module generates the feedback oscillation based on the output oscillation and a divider value. The scaling module is operably coupled to produce the scaling signal based on the selected divider. Accordingly, by scaling the charge current in accordance with the divider value, fixed components may be used for the loop filter and still provide the desired frequency response for various divider values. As such, a loop filter may readily be implemented on an integrated circuit and require a relatively some amount of die area.

DETAILED DESCRIPTION OF A PREFERRED EMBODIMENT

Figure 1:
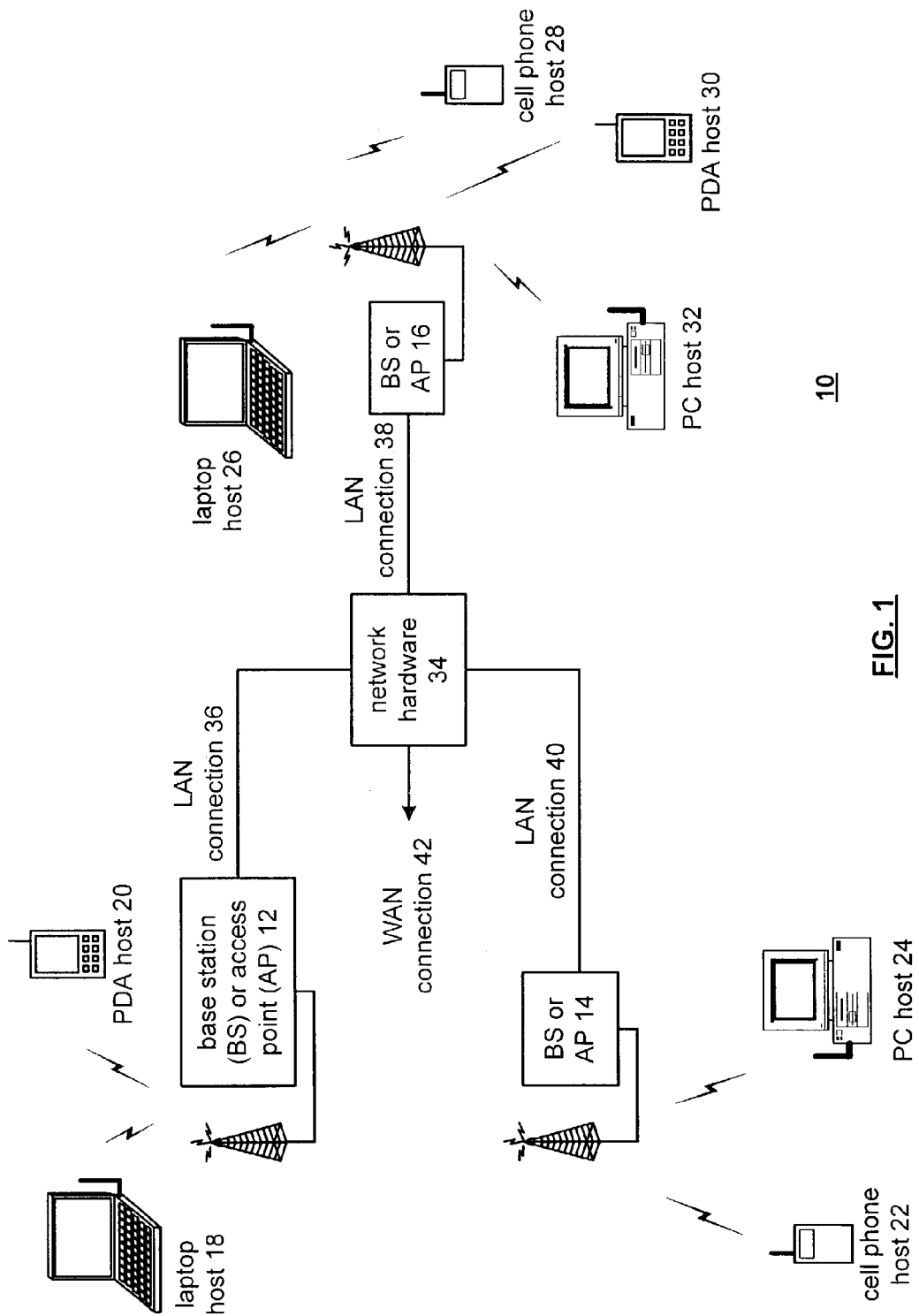
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
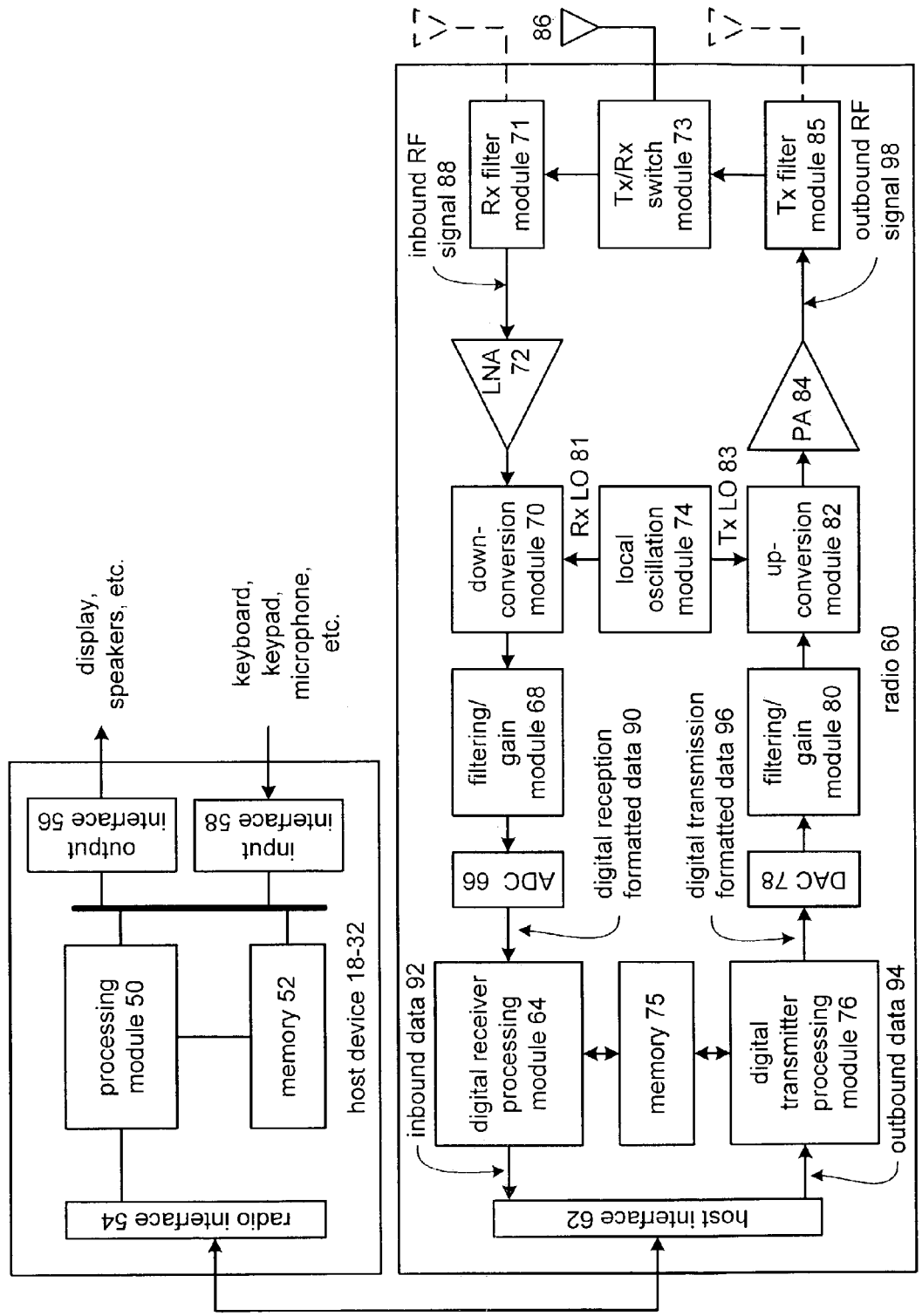
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
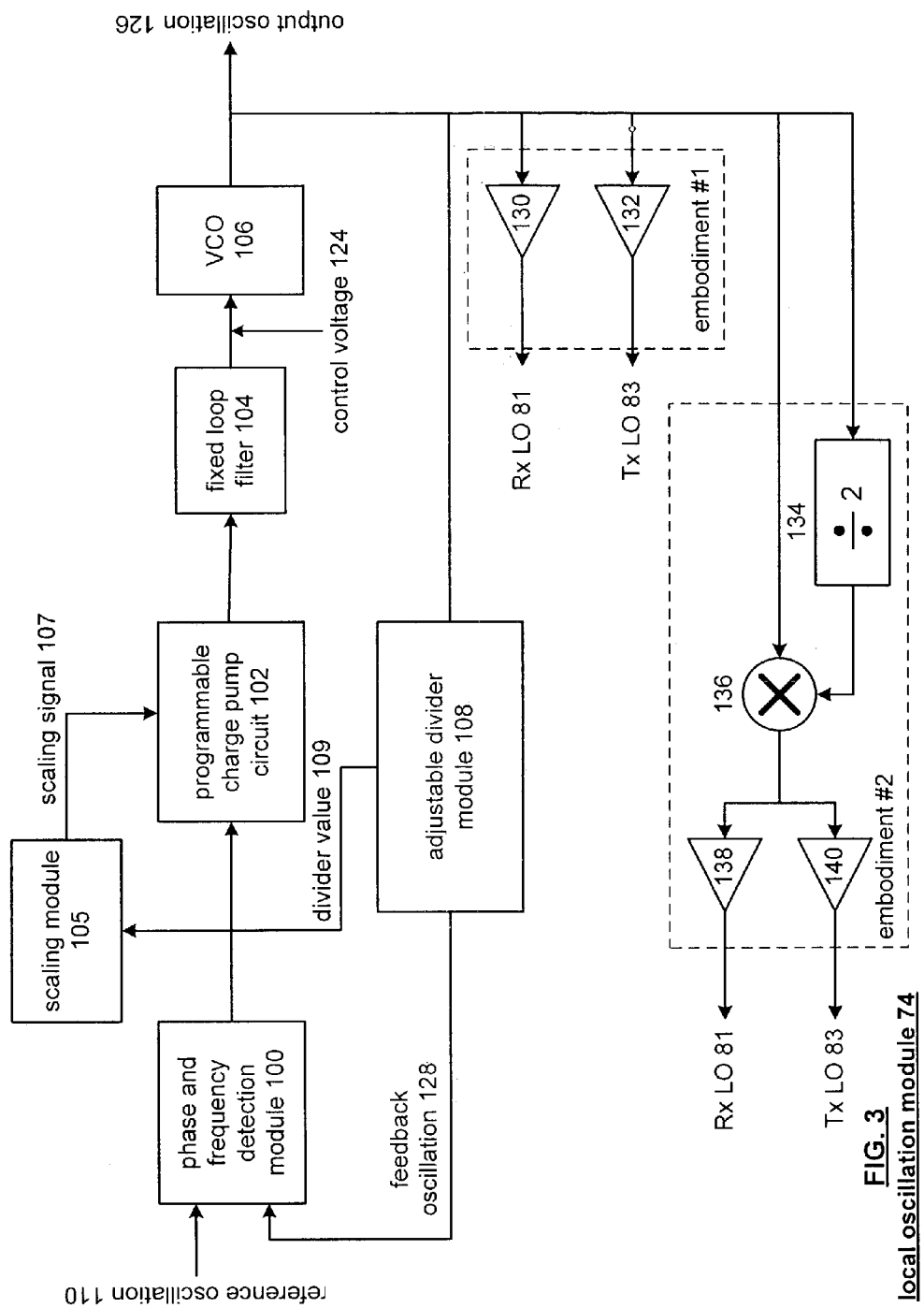
FIG. 3 is a schematic block diagram of a local oscillation module in accordance with the present invention.

FIG. 3 illustrates an embodiment of the local oscillation module 74 that includes a phase and frequency detection module 100, a programmable charge pump circuit 102, a loop filter 104, a voltage controlled oscillator (VCO) 106, a scaling module 105, and an adjustable divider module 108. The receiver local oscillation 81 and the transmitter local oscillation 83 may be generated from the output oscillation 128 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. The reference oscillation 110 may be produced by a crystal oscillator and/or another type of clock source. The phase and frequency detection module 100 produces a charge-up signal when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal when the phase and/or frequency of the feedback oscillation 128 leads the phase and/or frequency of the reference oscillation 110. In this condition, the output oscillation 126 is above its desired rate. The phase and frequency detection module 100 produces an off signal when the phase and/or frequency of the feedback oscillation 128 is aligned with the phase and/or frequency of the reference oscillation 110. In addition, the phase and/or frequency detection module 100 produces the off signal when not producing the charge-up signal or charge-down signal.

The programmable charge pump circuit 102 receives the charge-up signal, the charge-down signal and the off signal. In response to the charge-up signal, the charge pump 102 produces a positive current, in response to the charge-down signal, the charge pump circuit 102 produces a negative current, and, in response to the off signal, the charge pump produces a zero current. The magnitude of the negative current and the positive current will be scaled based on the scaling signal 107, where, as the divider ratio changes, the current provided to the loop filter changes such that the phase and frequency response of the loop filter remains relatively constant.

The loop filter 104, which will described in greater detail with reference to FIGS. 4 & 6, receives the positive current, negative current and the zero current and produces therefrom a control voltage 124. The loop filter 104 provides the control voltage 124 to the voltage control oscillator 106. The voltage control oscillator 106 generates the output oscillation 126 based on the control voltage 124.

The adjustable divider module 108, divides the output oscillation 126 by an adjustable divider value to produce the feedback oscillation 128. The adjustable divider module 108 may, in general, include a Delta Sigma modulator, register and summing module. The Delta Sigma modulator is operably coupled to generate an over sampled digital data stream that represents a fractional component of the fractional-N value. The register stores an integer component of the fractional-N value while the summing module sums the over sampled digital data stream with the integer component to produce the fractional-N value. The Delta Sigma modulator may be a $3^{rd}$ order mash Delta Sigma modulator.

Figure 4:
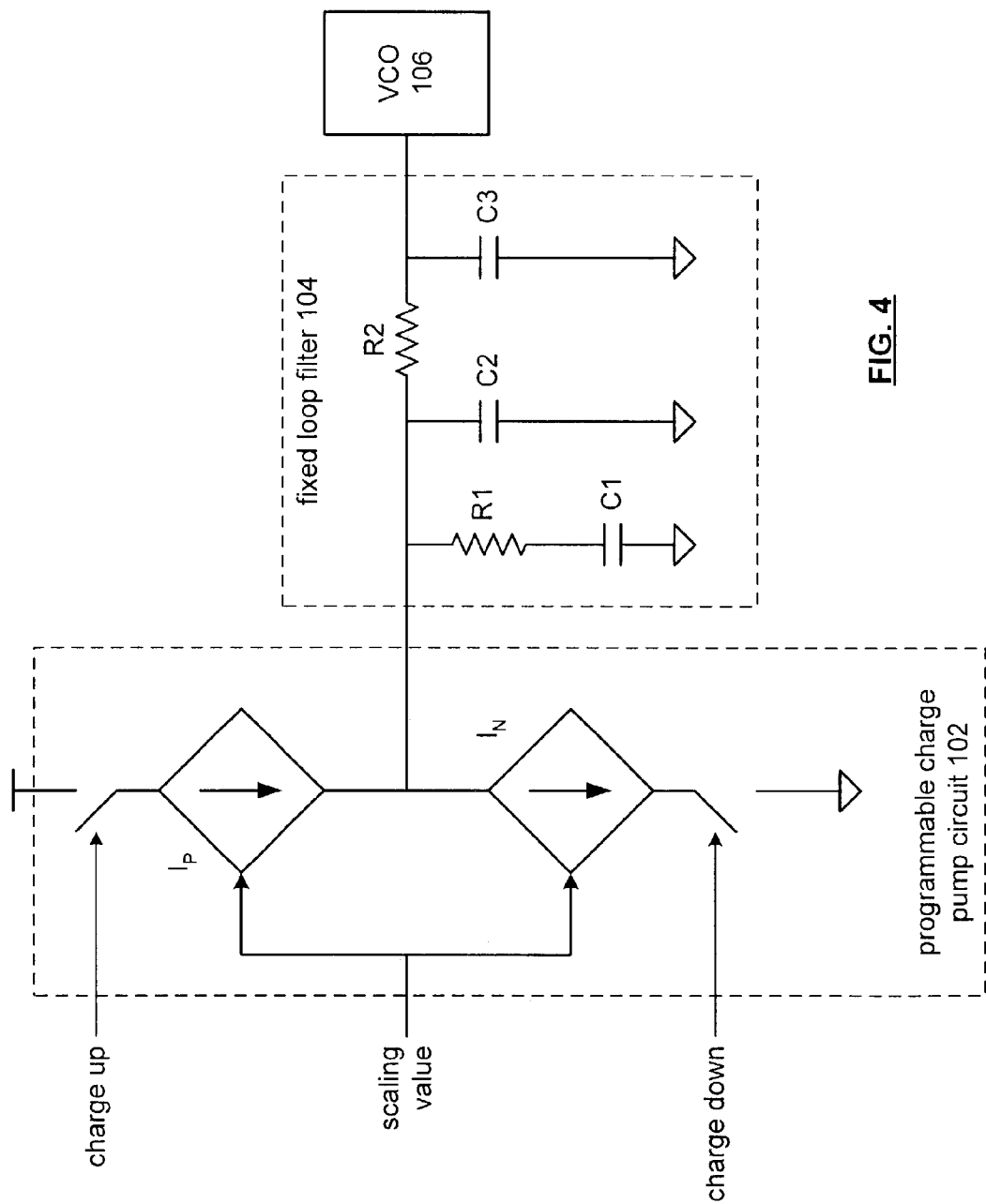
FIG. 4 is a schematic block diagram of a programmable charge pump, loop filter and voltage controlled oscillator in accordance with the present invention.

FIG. 4 is a schematic block diagram of the programmable charge pump 102, fixed loop filter 104 and voltage controlled oscillator 106 of the local oscillation module 74 of FIG. 3. The programmable charge pump circuit 102 includes two dependent current sources that produce a positive current ($I_p$) and a negative current ($I_n$). The fixed loop filter 104 includes resistors R1 and R2 and capacitors C1, C2, and C3.

The scaling value adjusts the current produced by the programmable charge pump circuit 102 to maintain a desired response of loop filter 104. In particular, the loop filter 104 provides a low pass filter having its corner frequency (i.e., the −3 dB frequency set based on the equation:

$$\omega_{3\,dB} = \omega_n (1 + 2\zeta^2 + (2 + 4\zeta^2 + 4\zeta^4)^{1/2})^{1/2}$$

where $\omega_n$ corresponds to the corner frequency of the filter response. Based on the desired −3 dB frequency, and a selected dampening factor ($\zeta$), the values of C1, C2, C3, R1 and R2 may be determined. For example, $$C1 = (K_{pd} * K_{vco})/(\omega_n^2 * N)$$

$$C2 = C1/15$$

$$C3 = C1/30$$

$$R1 = (2 * \zeta * \omega_n * N)/(K_{pd} * K_{vco})$$

$$R2 = R1$$

where $\zeta$ equals the dampening factor, $K_{pd}$ equals the charge current, $K_{vco}$ equals the gain of the voltage controlled oscillator, and N equals the divider ratio. From these equations, it is apparent that C1 is the dominant capacitor with respect to die area requirements. For the same dampening factor and loop bandwidth, the smaller the $K_{vco}$ and $K_{pd}$, the less die area required for C1. In order to achieve a smaller $K_{vco}$, the VCO is calibrated using a small varactor, or the like, and/or an array of switched capacitors and calibration circuits to tune the VCO's center frequency to be around the desired channel. In addition to reducing $K_{vco}$, $K_{pd}$ may be further reduced but not to a point where extra phase noise is introduced. As such, the value of $K_{pd}$ should be optimized in a way that the noise contribution is still low enough to meet the specification requirements. Accordingly, if the divider ratio changes, either due to channel selection variations, or the use of different reference oscillations, the value of C1 and R1 may be maintained in at a constant value while still obtaining the desired loop response by correspondingly adjusting the charge pump current. In other words, the charge pump current is scaled proportionately to the inverse of the variation of the divider ratio N.

Typically, the capacitors C1–C3 should have a high density such as a MOS capacitor that used as an N-MOS transistor in an N-well to shift the threshold voltage to around zero volts. As such, in the normal operating range of the MOS capacitor, the variation of the capacitance will be minimized. Resistors R1 and R2 may be variable resistors to further fine-tune the loop response of the loop filter. As an example of a loop filter, assume that the −3 dB frequency corresponds to 70 kilohertz, the dampening factor is 1, the gain of the VCO is 200 megahertz per volt, the charge current is 100 micro-amps and the frequency output is N time the frequency of the crystal reference. Further assume that the crystal reference is initially 10 megahertz and the desired output frequency is 1 gigahertz such that N=100. If the crystal reference changes to a 20 megahertz reference, N then changes to 50. If N changes to 50, the charge pump current is increased by a factor of 2 and thus would be 200 micro-amps. This maintains the same dampening factor of 1 and a −3 dB frequency of 70 kilohertz without having to change the gain of the VCO.

Figure 5:
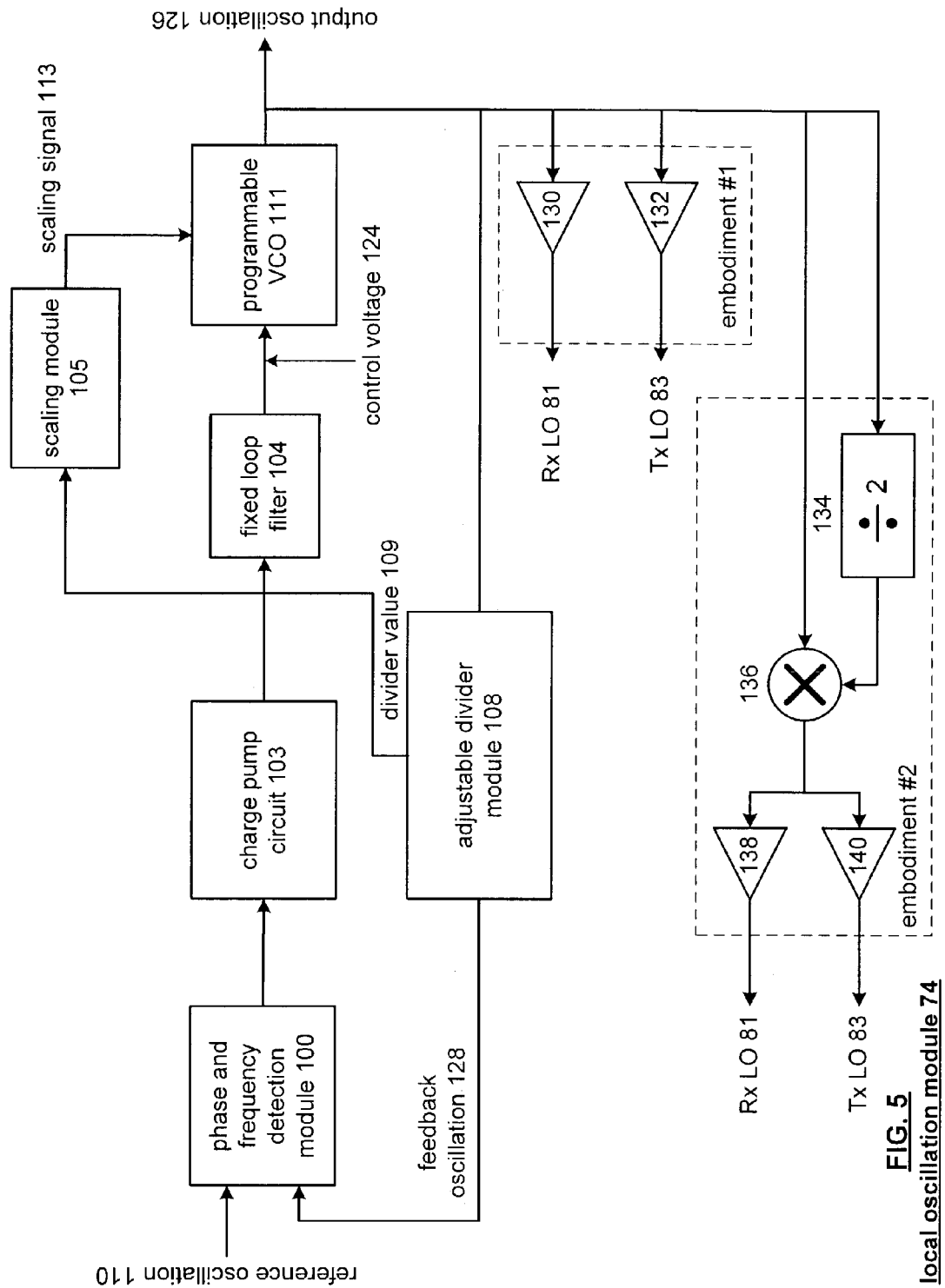
FIG. 5 is a schematic block diagram of an alternate embodiment of a local oscillation module in accordance with the present invention.

FIG. 5 illustrates an alternate embodiment of the local oscillation module 74 that includes a phase and frequency detection module 100, a charge pump circuit 102, a loop filter 104, a programmable voltage controlled oscillator (VCO) 111, a scaling module 105, and an adjustable divider module 108. The receiver local oscillation 81 and the transmitter local oscillation 83 may be generated from the output oscillation 128 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. The reference oscillation 110 may be produced by a crystal oscillator and/or another type of clock source. The phase and frequency detection module 100 produces a charge-up signal when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal when the phase and/or frequency of the feedback oscillation 128 leads the phase and/or frequency of the reference oscillation 110. In this condition, the output oscillation 126 is above its desired rate. The phase and frequency detection module 100 produces an off signal when the phase and/or frequency of the feedback oscillation 128 is aligned with the phase and/or frequency of the reference oscillation 110. In addition, the phase and/or frequency detection module 100 produces the off signal when not producing the charge-up signal or charge-down signal.

The charge pump circuit 103 receives the charge-up signal, the charge-down signal and the off signal. In response to the charge-up signal, the charge pump 103 produces a positive current, in response to the charge-down signal, the charge pump circuit 103 produces a negative current, and, in response to the off signal, the charge pump produces a zero current.

The loop filter 104, which will described in greater detail with reference to FIGS. 4 & 6, receives the positive current, negative current and the zero current and produces therefrom a control voltage 124. The loop filter 104 provides the control voltage 124 to the programmable voltage control oscillator 111. The programmable voltage control oscillator 111 generates the output oscillation 126 based on the control voltage 124 and on the scaling signal 113.

The adjustable divider module 108, divides the output oscillation 126 by an adjustable divider value 109 to produce the feedback oscillation 128. The adjustable divider module 108 may, in general, include a Delta Sigma modulator, register and summing module. The Delta Sigma modulator is operably coupled to generate an over sampled digital data stream that represents a fractional component of the fractional-N value. The register stores an integer component of the fractional-N value while the summing module sums the over sampled digital data stream with the integer component to produce the fractional-N value. The Delta Sigma modulator may be a $3^{rd}$ order mash Delta Sigma modulator.

Figure 6:
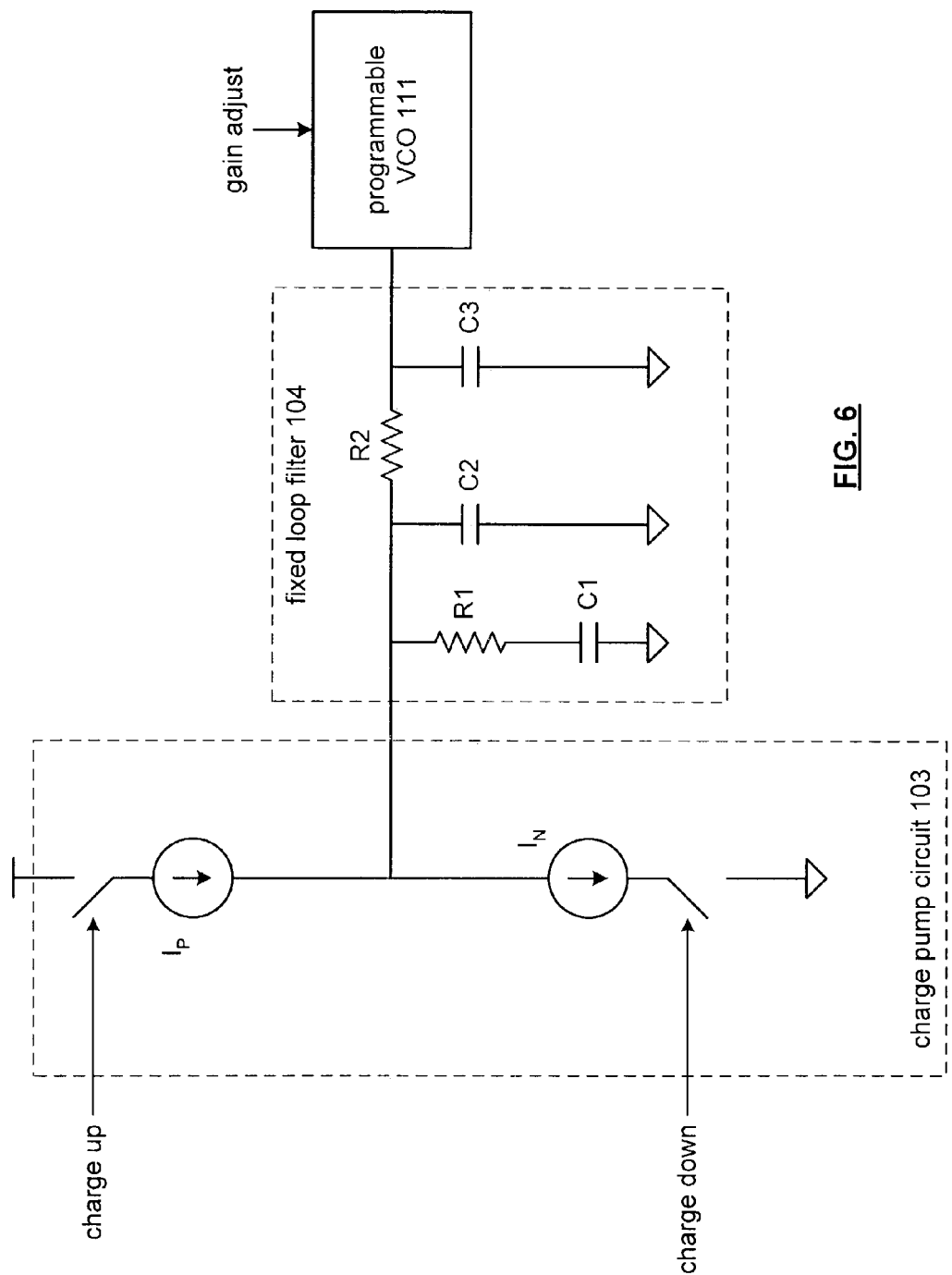
FIG. 6 is a schematic block diagram of an alternate charge pump, fixed loop filter, and programmable voltage controlled oscillator in accordance with the present invention.

FIG. 6 illustrates the charge pump circuit 103, fixed loop filter 104 and programmable VCO 111 of FIG. 5. In this embodiment, the current sources of the charge pump circuit 103 are fixed currents. The components of the loop filter 104 C1–C3 and R1 and R2 are fixed components based on the equations referenced above. In this instance, to use fixed components for the loop filter, when the desired output frequency changes or the crystal reference changes, such that the divider value changes, the gain of the programmable voltage controlled oscillator 111 is proportionally adjusted. Typically, the gain of the programmable voltage controlled oscillator 111 may be adjusted by switching in and/or out capacitance to adjust the frequency-to-voltage ratio.

The preceding discussion has presented a phase locked loop having an on-chip loop filter. By adjusting the value of the charge current and/or the gain of the voltage controlled oscillator, fixed components may be used for the loop filter. By utilizing fixed components for the loop filter, they may be implemented on-chip without undue size requirements. As one of average skill in the art will appreciate, other embodiments may be derived from the teaching of the present invention without deviating from the scope of the claims.

What is claimed is:

1. A phase locked loop comprises:
   difference detector operably coupled to determine a difference signal based on a reference oscillation and a feedback oscillation;
   programmable charge pump operably coupled to generate a charge current based on the difference signal and a scaling signal;
   fixed loop filter operably coupled to convert the charge current into a control voltage, the fixed loop filter including a first capacitor, a second capacitor, a third capacitor, a first resistor and a second resistor;
   voltage controlled oscillator operably coupled to generate an output oscillation based on the control voltage;
   adjustable divider module operably coupled to generate the feedback oscillation based on the output oscillation and a divider value; and
   scaling module operably coupled to produce the scaling signal based on the divider value;
   wherein the first capacitor has a capacitance based on a gain of the voltage controlled oscillator, corner frequency of the loop filter, the charge current, and the divider value; the first resistor is coupled in series with the first capacitor, in which the first resistor has a resistance based on the gain of the voltage controlled oscillator, the corner frequency of the loop filter, the charge current, a dampening factor, and the divider value; the second capacitor is coupled in parallel with the series combination of the first resistor and the first capacitor, in which the second capacitor has a capacitance based on the capacitance of the first capacitor; the second resistor is coupled to the second capacitor, in which the second resistor has a resistance based on the first resistor; and the third capacitor is coupled to the second resistor, in which the third capacitor has a capacitance based on the capacitance of the first capacitor.

2. The phase locked loop of claim 1, wherein each of the first, second, and third capacitors further comprises:
   on-chip Metal Oxide Semiconductor (MOS) capacitor.

3. The phase locked loop of claim 2, wherein each of the first, second, and third capacitors further comprises:
   a Negative MOS capacitor in a Negative well to provide a depletion mode field effect transistor configured as a capacitor.

4. The phase locked loop of claim 2, wherein each of the first, second, and third capacitors further comprises:
   adjustable on-chip MOS capacitor.

5. The phase locked loop of claim 1, wherein each of the first and second resistors further comprises:
   on-chip resistors.

6. The phase locked loop of claim 1, wherein the scaling module functions to:
   determine adjustment of the divider value with respect to a reference divider value;
   generate the scaling signal based on the adjustment of the divider value such that a ratio between the charge current and the divider value remains relatively constant.

7. The phase locked loop of claim 6, wherein the programmable charge pump further comprises:
   dependent current sources to generate the charge current, wherein the scaling signal adjusts magnitude of currents provided by the dependent current sources and the difference signal adjusts overlap of the currents provided by the dependent current sources.

8. The phase locked loop of claim 1, wherein the adjustable divider module further comprises:
   an adjustable integer divider module operably coupled to provide an integer portion of the divider value; and
   an adjustable fractional divider module operably coupled to provide a fractional portion of the divider value.

9. A radio frequency integrated circuit (RFIC) comprises:
   transmitter section operably coupled to convert outbound data into outbound radio frequency (RF) signals based on a transmitter local oscillation;
   receiver section operably coupled to convert inbound RF signals into inbound data based on a receiver local oscillation; and
   local oscillator operably coupled to produce the transmitter local oscillation and the receiver local oscillation, wherein the local oscillator includes:

difference detector operably coupled to determine a difference signal based on a reference oscillation and a feedback oscillation;

programmable charge pump operably coupled to generate a charge current based on the difference signal and a scaling signal;

fixed loop filter operably coupled to convert the charge current into a control voltage, the fixed loop filter including a first capacitor, a second capacitor, a third capacitor, a first resistor and a second resistor;

voltage controlled oscillator operably coupled to generate an output oscillation based on the control voltage;

adjustable divider module operably coupled to generate the feedback oscillation based on the output oscillation and a divider value; and scaling module operably coupled to produce the scaling signal based on the selected divider value;

wherein the first capacitor has a capacitance based on a gain of the voltage controlled oscillator, corner frequency of the loop filter, the charge current, and the divider value; the first resistor is coupled in series with the first capacitor, in which the first resistor has a resistance based on the gain of the voltage controlled oscillator, the corner frequency of the loop filter, the charge current, a dampening factor, and the divider value; the second capacitor is coupled in parallel with the series combination of the first resistor and the first capacitor, in which the second capacitor has a capacitance based on the capacitance of the first capacitor; the second resistor is coupled to the second capacitor, in which the second resistor has a resistance based on the first resistor, and the third capacitor is coupled to the second resistor, in which the third capacitor has a capacitance based on the capacitance of the first capacitor.

10. The RFIC of claim 9, wherein each of the first, second, and third capacitors further comprises:
on-chip Metal Oxide Semiconductor (MOS) capacitor.

11. The RFIC of claim 10, wherein each of the first, second, and third capacitors further comprises:
a Negative MOS capacitor in a Negative well to provide a depletion mode field effect transistor configured as a capacitor.

12. The RFIC of claim 10, wherein each of the first, second, and third capacitors further comprises:
adjustable on-chip MOS capacitor.

13. The RFIC of claim 9, wherein each of the first and second resistors further comprises:
on-chip resistors.

14. The RFIC of claim 9, wherein the scaling module functions to:
determine adjustment of the divider value with respect to a reference divider value;
generate the scaling signal based on the adjustment of the divider value such that a ratio between the charge current and the divider value remains relatively constant.

15. The RFIC of claim 14, wherein the programmable charge pump further comprises:
dependent current sources to generate the charge current, wherein the scaling signal adjusts magnitude of currents provided by the dependent current sources and the difference signal adjusts overlap of the currents provided by the dependent current sources.

16. The RFIC of claim 9, wherein the adjustable divider module further comprises:

an adjustable integer divider module operably coupled to provide an integer portion of the divider value; and
an adjustable fractional divider module operably coupled to provide a fractional portion of the divider value.

17. A phase locked loop comprises:
difference detector operably coupled to determine a difference signal based on a reference oscillation and a feedback oscillation;

charge pump operably coupled to generate a charge current based on the difference signal and a scaling signal;

fixed loop filter operably coupled to convert the charge current into a control voltage, the fixed loop filter including a first capacitor, a second capacitor, a third capacitor, a first resistor and a second resistor;

programmable voltage controlled oscillator operably coupled to generate an output oscillation based on the control voltage and the scaling signal;

adjustable divider module operably coupled to generate the feedback oscillation based on the output oscillation and a divider value; and scaling module operably coupled to produce the scaling signal based on the divider value;

wherein the first capacitor has a capacitance based on a gain of the voltage controlled oscillator, corner frequency of the loop filter, the charge current, and the divider value; the first resistor is coupled in series with the first capacitor, in which the first resistor has a resistance based on the gain of the voltage controlled oscillator, the corner frequency of the loop filter, the charge current, a dampening factor, and the divider value; the second capacitor is coupled in parallel with the series combination of the first resistor and the first capacitor, in which the second capacitor has a capacitance based on the capacitance of the first capacitor; the second resistor is coupled to the second capacitor, in which the second resistor has a resistance based on the first resistor; and the third capacitor is coupled to the second resistor, in which the third capacitor has a capacitance based on the capacitance of the first capacitor.

18. The phase locked loop of claim 17, wherein each of the first, second, and third capacitors further comprises:
on-chip Metal Oxide Semiconductor (MOS) capacitor.

19. The phase locked loop of claim 18, wherein each of the first, second, and third capacitors further comprises:
a Negative MOS capacitor in a Negative well to provide a depletion mode field effect transistor configured as a capacitor.

20. The phase locked loop of claim 18, wherein each of the first, second, and third capacitors further comprises:
adjustable on-chip MOS capacitor.

21. The phase locked loop of claim 17, wherein each of the first and second resistors further comprises:
on-chip resistors.

22. The phase locked loop of claim 17, wherein the scaling module functions to:
determine adjustment of the divider value with respect to a reference divider value;
generate the scaling signal based on the adjustment of the divider value such that a ratio between gain of the voltage controlled oscillator and the divider value remains relatively constant.

23. The phase locked loop of claim 22, wherein the programmable voltage controlled oscillator further comprises:

voltage to frequency conversion module operably coupled to produce the output oscillation based on the control voltage; and switchable capacitor bank operable to adjust gain of the voltage to frequency conversion module based on the scaling signal.

24. A radio frequency integrated circuit (RFIC) comprises:

receiver section operably coupled to convert outbound data into outbound radio frequency (RF) signals based on a transmitter local oscillation;

receiver section operably coupled to convert inbound RF signals into inbound data based on a receiver local oscillation; and local oscillator operably coupled to produce the transmitter local oscillation and the receiver local oscillation, wherein the local oscillator includes:

difference detector operably coupled to determine a difference signal based on a reference oscillation and a feedback oscillation;

charge pump operably coupled to generate a charge current based on the difference signal and a scaling signal;

fixed loop filter operably coupled to convert the charge current into a control voltage, the fixed loop filter including a first capacitor, a second capacitor, a third capacitor, a first resistor and a second resistor;

programmable voltage controlled oscillator operably coupled to generate an output oscillation based on the control voltage and the scaling signal;

adjustable divider module operably coupled to generate the feedback oscillation based on the output oscillation and a divider value; and scaling module operably coupled to produce the scaling signal based on the selected divider value;

wherein the first capacitor has a capacitance based on a gain of the voltage controlled oscillator, corner frequency of the loop filter, the charge current, and the divider value; the first resistor is coupled in series with the first capacitor, in which the first resistor has a resistance based on the gain of the voltage controlled oscillator, the corner frequency of the loop filter, the charge current, a dampening factor, and the divider value; the second capacitor is coupled in parallel with the series combination of the first resistor and the first capacitor, in which the second capacitor has a capacitance based on the capacitance of the first capacitor; the second resistor is coupled to the second capacitor, in which the second resistor has a resistance based on the first resistor; and the third capacitor is coupled to the second resistor, in which the third capacitor has a capacitance based on the capacitance of the first capacitor.

25. The RFIC of claim 24, wherein each of the first, second, and third capacitors further comprises:

on-chip Metal Oxide Semiconductor (MOS) capacitor.

26. The RFIC of claim 25, wherein each of the first, second, and third capacitors further comprises:

a Negative MOS capacitor in a Negative well to provide a depletion mode field effect transistor configured as a capacitor.

27. The RFIC of claim 25, wherein each of the first, second, and third capacitors further comprises:

adjustable on-chip MOS capacitor.

28. The RFIC of claim 24, wherein each of the first and second resistors further comprises:

on-chip resistors.

29. The RFIC of claim 24, wherein the scaling module functions to:

determine adjustment of the divider value with respect to a reference divider value;

generate the scaling signal based on the adjustment of the divider value such that a ratio between gain of the voltage controlled oscillator and the divider value remains relatively constant.

30. The RFIC of claim 29, wherein the programmable voltage controlled oscillator further comprises:

voltage to frequency conversion module operably coupled to produce the output oscillation based on the control voltage; and switchable capacitor bank operable to adjust gain of the voltage to frequency conversion module based on the scaling signal.

* * * * *